United States Patent
Hacking et al.

(10) Patent No.: US 9,830,954 B2
(45) Date of Patent: Nov. 28, 2017

(54) METHOD AND SYSTEM FOR DYNAMIC POWER MANAGEMENT OF MEMORIES

(75) Inventors: Lance E. Hacking, Austin, TX (US); Hee-Jun Park, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 756 days.

(21) Appl. No.: 13/069,647

(22) Filed: Mar. 23, 2011

(65) Prior Publication Data
US 2012/0243364 A1 Sep. 27, 2012

(51) Int. Cl.
*G11C 5/14* (2006.01)
*G11C 11/4074* (2006.01)

(52) U.S. Cl.
CPC ............. *G11C 5/147* (2013.01); *G11C 5/148* (2013.01); *G11C 11/4074* (2013.01)

(58) Field of Classification Search
USPC .............................. 365/227, 226, 222, 233.15
See application file for complete search history.

(56) References Cited

U.S. PATENT DOCUMENTS

| | | | |
|---|---|---|---|
| 5,734,618 A | 3/1998 | Mizuta | |
| 5,771,198 A * | 6/1998 | Kang et al. | 365/229 |
| 7,272,741 B2 | 9/2007 | Wilcox et al. | |
| 7,315,952 B2 | 1/2008 | Wilcox et al. | |
| 7,360,103 B2 | 4/2008 | Lint et al. | |
| 7,877,619 B2 | 1/2011 | Rachakonda et al. | |
| 8,050,177 B2 | 11/2011 | Hacking et al. | |
| 8,145,926 B2 | 3/2012 | Park et al. | |
| 8,392,728 B2 | 3/2013 | Hacking et al. | |
| 8,621,246 B2 | 12/2013 | Ravichandran et al. | |
| 8,656,411 B2 | 2/2014 | Hacking | |
| 2002/0018387 A1 * | 2/2002 | Nam et al. | 365/222 |
| 2005/0105352 A1 * | 5/2005 | Lee | 365/202 |
| 2006/0006166 A1 * | 1/2006 | Chen et al. | 219/494 |
| 2006/0198225 A1 * | 9/2006 | Spengler | 365/222 |
| 2009/0085604 A1 * | 4/2009 | David | 326/30 |
| 2009/0323452 A1 * | 12/2009 | Cagno et al. | 365/227 |

(Continued)

FOREIGN PATENT DOCUMENTS

| | | |
|---|---|---|
| JP | 09-222939 | 8/1997 |
| JP | 2009-087322 | 4/2009 |

(Continued)

OTHER PUBLICATIONS

International Search Report and Written Opinion for PCT Patent Application No. PCT/US2012/024185 dated Aug. 14, 2012, 9 Pages.

(Continued)

*Primary Examiner* — Douglas King
(74) *Attorney, Agent, or Firm* — Compass IP Law PC

(57) ABSTRACT

A method and apparatus for dynamic power management of memories. In one embodiment of the invention, the power consumption of the memories is reduced based on the operating state of the memories. For example, in one embodiment of the invention, the power supply to the memories is reduced when the memories are in an inactive state by reducing and/or turning off the input voltage(s) to the memories. In one embodiment of the invention, the processing unit dynamically changes the strength of the On-Die Termination pull-up/pull-down resistance based on the memory operating mode, memory voltage, and memory temperature.

14 Claims, 3 Drawing Sheets

(56) References Cited

U.S. PATENT DOCUMENTS

| | | |
|---|---|---|
| 2010/0110815 A1 | 5/2010 | Lee et al. |
| 2010/0262769 A1* | 10/2010 | Janzen .......................... 711/106 |
| 2011/0026352 A1 | 2/2011 | Yuan |
| 2011/0078465 A1* | 3/2011 | Ito ................................ 713/300 |
| 2014/0149999 A1 | 5/2014 | Hacking |

FOREIGN PATENT DOCUMENTS

| | | |
|---|---|---|
| KR | 10-1999-0013146 | 2/1999 |
| KR | 05-86255 | 8/2005 |
| KR | 1020050086255 | 8/2005 |
| WO | WO-2012128852 | 9/2012 |

OTHER PUBLICATIONS

The Notice of Preliminary Rejection in related Korean Patent Application No. 2013-7025649, dated Aug. 28, 2014, 10 pages including English Translation.

International Preliminary Report on Patentability and Written Opinion for PCT Patent Application No. PCT/US2012/024185 dated Oct. 3, 2013, 5 Pages.

* cited by examiner

METHOD AND SYSTEM FOR DYNAMIC POWER MANAGEMENT OF MEMORIES

FIELD OF THE INVENTION

This invention relates to memories, and more specifically but not exclusively, to a method and system for dynamic power management of memories.

BACKGROUND DESCRIPTION

The voltage supplied to a memory device is typically set at a nominal voltage level that is recommended by the manufacturer of the memory device. The voltage supplied to the memory device is constant or static for all operating modes of memory device.

BRIEF DESCRIPTION OF THE DRAWINGS

The features and advantages of embodiments of the invention will become apparent from the following detailed description of the subject matter in which.

DETAILED DESCRIPTION

Figure 1:
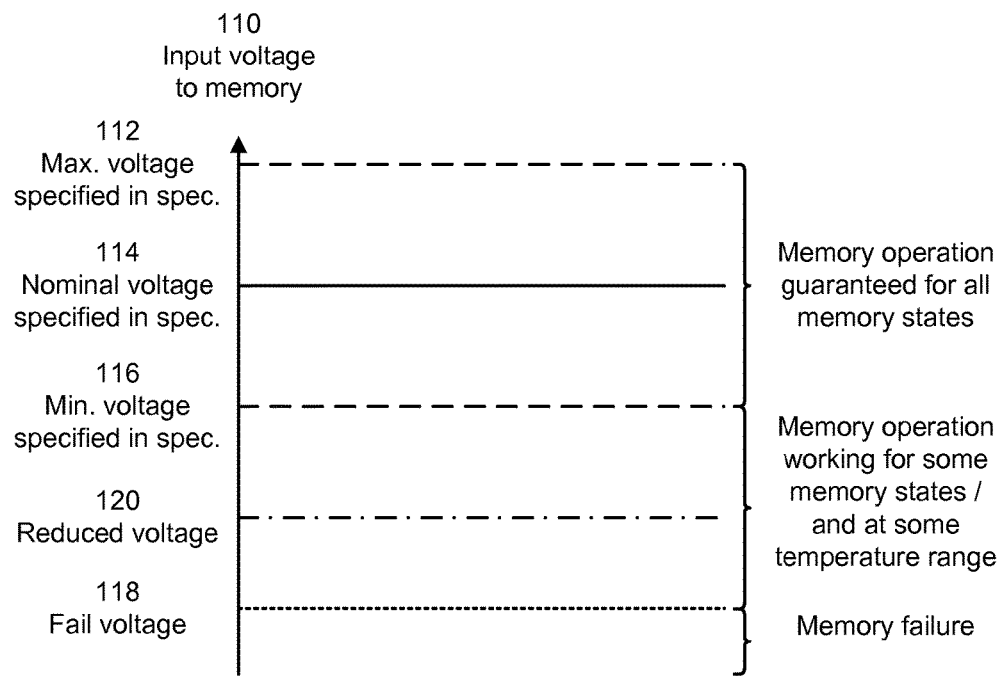
FIG. 1 illustrates an input voltage setting of a memory device in accordance with one embodiment of the invention.

Embodiments of the invention described herein are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference numerals have been repeated among the figures to indicate corresponding or analogous elements. Reference in the specification to "one embodiment" or "an embodiment" of the invention means that a particular feature, structure, or characteristic described in connection with the embodiment is included in at least one embodiment of the invention. Thus, the appearances of the phrase "in one embodiment" in various places throughout the specification are not necessarily all referring to the same embodiment.

Embodiments of the invention provide a method and system for dynamic power management of memories. In one embodiment of the invention, the power consumption of the memories is reduced based on the operating state of the memories. For example, in one embodiment of the invention, the voltage supply to the memories is reduced when the memories are in an inactive state. The inactive state of the memories includes, but is not limited to, a self-refresh state, and any other state that does not require any read or write operations. In one embodiment of the invention, the power consumption of the memories is reduced by reducing and/or turning off the input voltage(s) to the memories.

In one embodiment of the invention, the strength of On-Die Termination (ODT) of one or more signals coupled with a memory device is reduced based at least in part on the operating mode of the memory. The one or more signals include, but are not limited to, address signals, data signals, control signals, interrupt signals, and any other signals of the memory device. By reducing the strength of the ODT of the one or more signals, the power consumption of the memory device and processor is reduced in one embodiment of the invention. In one embodiment of the invention, the alteration of the strength of the ODT of the one or more signals coupled with the memory device is based on one or more criterion including, but is not limited to, the operating mode of the memory device, the input voltage(s) of the memory device, the temperature of the memory device, and other criteria that may affect the information retention of the memory device.

The memory device includes, but is not limited to, a Double Data Rate Dynamic Random Access Memory (DRAM) (DDR), Double Data Rate Two DRAM (DDR2), Double Data Rate Three DRAM (DDR3), Double Data Rate Four DRAM (DDR4), and other types of DRAMs.

FIG. 1 illustrates an input voltage setting 100 of a memory device in accordance with one embodiment of the invention. FIG. 1 illustrates different input voltage settings to the memory device. The nominal voltage 114 illustrates the voltage level specified by the manufacturer of the memory device for normal operation of the memory device. The maximum voltage 112 and the minimum voltage 116 illustrate the maximum and minimum voltage levels respectively where the memory device is guaranteed to operate correctly for all memory states, i.e., voltage margin of the memory device.

In one embodiment of the invention, the input voltage of the memory device is set to a reduced voltage level 120 when the memory device is in an inactive mode. The fail voltage 118 illustrates a voltage level where the memory device fails if it has an input voltage that is set below the fail voltage. The reduced voltage 120 is set to a voltage level between the minimum voltage 116 and the fail voltage 118 in one embodiment of the invention. When the input voltage of the memory device is set to the reduced voltage 120, the memory device functions for some memory states including, but are not limited to, the self-refresh state and the like, at some temperature range.

For example, in one embodiment of the invention, when the input voltage of the memory device is set to the reduced voltage 120, the memory device is able to retain its stored information. This allows the memory device to be set at a reduced voltage 120 when it is in an inactive state in one embodiment of the invention. When the memory device is in the active state, the memory device is set to the nominal voltage 114 or any other voltage level between the maximum voltage 112 and the minimum voltage 116. By dynamically adjusting the voltage level of the memory device based on the operating state of the memory device, the power consumption of the memory device can be reduced in one embodiment of the invention.

In one embodiment of the invention, the voltage range of the reduced voltage 120 is determined based on, but is not limited to, the process corners of the memory dices in the memory device, temperature, and other factors that may affect the operation of the memory device. For example, in one embodiment of the invention, the memory device is written with a known set of data when the input voltage level of the memory device is set at the nominal voltage 114. The input voltage level of the memory device is reduced to the minimum voltage 116 and a read operation is performed to determine if the memory device is able to retain the correct known set of data.

If there are no errors in the read data compared to the known set of data, the input voltage level of the memory device is reduced by a voltage step and a read operation is performed to determine if the memory device is able to retain the correct known set of data. If there are no errors in the read data compared to the known set of data, the cycle of lowering the input voltage, reading the data, and comparing the data is iterated until an error is detected in the read data. The input voltage level of the memory device at which the error occurs is set as the fail voltage in one embodiment of the invention. In another embodiment of the invention, the process of determining the fail voltage of the memory device is repeated across different process corners of the memory device. This allows the determination of a fail voltage that is applicable to the different process corners of the memory device.

In yet another embodiment of the invention, the process of determining the fail voltage of the memory device is repeated across different temperatures of the memory device. This allows the determination of a fail voltage that is applicable to different temperatures of the memory device. One of ordinary skill in the relevant art will readily appreciate how to determine the fail voltage based on other parameter settings and it shall not be described herein.

Figure 2:
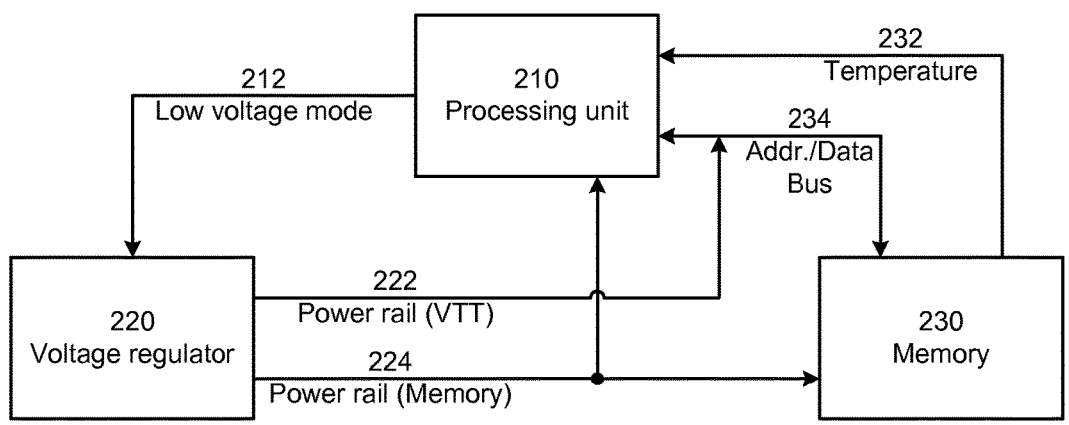
FIG. 2 illustrates a block diagram of a platform in accordance with one embodiment of the invention.

FIG. 2 illustrates a block diagram of a platform 200 in accordance with one embodiment of the invention. In one embodiment of the invention, the platform 200 includes, but is not limited to, a desktop computer, a laptop computer, a netbook, a tablet, a notebook computer, a personal digital assistant (PDA), a server, a workstation, a cellular telephone, a mobile computing device, an Internet appliance or any other type of computing device.

The platform 200 has a processing unit 210, a voltage regulator 220, and a memory 230 in one embodiment of the invention. In one embodiment of the invention, the processing unit 210 has one or more communication links with the memory 230. The communication links include, but are not limited to, address signals, data signals, temperature signals, control signals, interrupt signals, and the like. The communication links may be independent signals or form part of a bus signal in one embodiment of the invention.

In one embodiment of the invention, the processing unit 210 reads the temperature 232 of the memory 230. The processing unit 210 uses the temperature 232 of the memory 230 in its decision on whether the power consumption of the memory 230 can be reduced in one embodiment of the invention.

In one embodiment of the invention, the processing unit 210 determines whether the memory 230 is in an inactive state or mode. For example, when the memory 230 is in a self-refresh mode, the memory is maintaining its stored contents without performing any read or write operation. In the self-refresh mode of the memory 230, the memory 230 can still maintain its stored contents when the input voltage(s) are reduced from the nominal voltage level in one embodiment of the invention.

In the self-refresh mode of the memory 230, the units such as, but are not limited to, digital functional blocks, Input/Output (I/O) blocks, controller blocks, and any other blocks that require a nominal voltage to operate, can be switched off. This is because the memory cells in the memory 230 are only required to be charged repeatedly to retain its contents and the units can be switched off without affecting the memory 230 in one embodiment of the invention.

When the processing unit 210 has determined that the memory 230 is in an inactive state or mode, it indicates a low voltage mode 212 to the voltage regulator 220. In one embodiment of the invention, the processing unit 210 indicates the low voltage mode 212 to the voltage regulator 220 by using a communication signal. In another embodiment of the invention, the processing unit 210 indicates the low voltage mode 212 to the voltage regulator 220 by using side band signals.

For example, in one embodiment of the invention, the processing unit 210 sends voltage identification bits (VID) to indicate the low voltage mode 212 to the voltage regulator 220. The voltage identification bits can be sent via a communication interface in one embodiment of the invention. One of ordinary skill in the relevant art will readily appreciate that other methods of indicating the low voltage mode 212 can be used without affecting the workings of the invention and these other methods shall not be described herein.

In one embodiment of the invention, when the voltage regulator 220 receives the low voltage mode 212 from the processing unit, it changes the voltage level of the input voltages to the memory 230. In one embodiment of the invention, the voltage regulator 220 changes the voltage level of the input voltages to the memory 230 by switching off the power rail for the termination voltage (VTT) of the address and/or data signals 234 between the processing unit 210 and the memory 230. In another embodiment of the invention, the voltage regulator 220 changes the voltage level of the input voltages to the memory 230 by reducing the voltage of the power rail for the memory 230. In one embodiment of the invention, the voltage regulator 220 changes the voltage level of the input voltages to the memory 230 by reducing the voltage of the logic in the processing unit that interfaces with the memory 230.

In one embodiment of the invention, when the processing unit 210 determines that the memory 230 is required to switch to an active state, the processing unit 210 indicates to the voltage regulator 220 to exit from the low voltage mode 212. The voltage regulator 220 configures the power rails back to the normal operating voltage level when it has received the indication from the processing unit 210. In one embodiment of the invention, the voltage regulator 220 is selected such that it is able to configure the power rails back to normal operating voltage level before any access of the memory 230. This is to avoid any memory access errors that may occur when the processing unit 210 is accessing the memory 230 before the voltage levels of the memory 230 has been restored in one embodiment of the invention.

In one embodiment of the invention, the processing unit 210 has the ability to configure the ODT of the communication signal(s) with the memory 230. For example, in one embodiment of the invention, the processing unit 210 has the ability to configure the Input/Output (I/O) termination of the data signals with the memory 230.

In one embodiment of the invention, the strength of the pull up resistance of each pulled up signal between the processing unit 210 and the memory 230 is configurable by the processing unit 210. For example, the processing unit 210 can vary the strength the pull up resistance of the signal in one embodiment of the invention. Different values of pull up resistance coupled to the signal can be selected by the processing unit 210 in one embodiment of the invention.

Similarly, the processing unit 210 can configure the strength of the pull down resistance of each pulled down signal between the processing unit 210 and the memory 230. Different values of pull down resistance coupled to the signal can be selected by the processing unit 210 in one embodiment of the invention.

The platform 200 illustrated in FIG. 2 is not meant to be limiting and other configurations of the platform 200 can be used without affecting the workings of the invention. For example, in one embodiment of the invention, the voltage regulator 220 is integrated with the processing unit 210. When the voltage regulator 220 is integrated with the processing unit 210, the processing unit 210 may program the registers of the voltage regulator 220 to configure the voltage levels of the memory 230.

In another embodiment of the invention, the memory 230 is integrated with the processing unit 210 and the power domains of the memory 230 and the processing unit 210 are kept separate such that the voltage levels of the memory 230 can be reduced without affecting the operations of the processing unit 210. In yet another embodiment of the invention, the platform 200 is a system on chip with the processing unit 210, voltage regulator 220 and the memory 230 packaged in the same substrate. In one embodiment of the invention, the processing unit 210 and the memory 230 are integrated into one package or one silicon chip. In another embodiment of the invention, the processing unit 210 and the voltage regulator 220 are integrated into one package or one silicon chip. One of ordinary skill in the relevant art will readily appreciate other components of the platform 200 can be added without affecting the workings of the invention and shall not be described herein.

Figure 3:
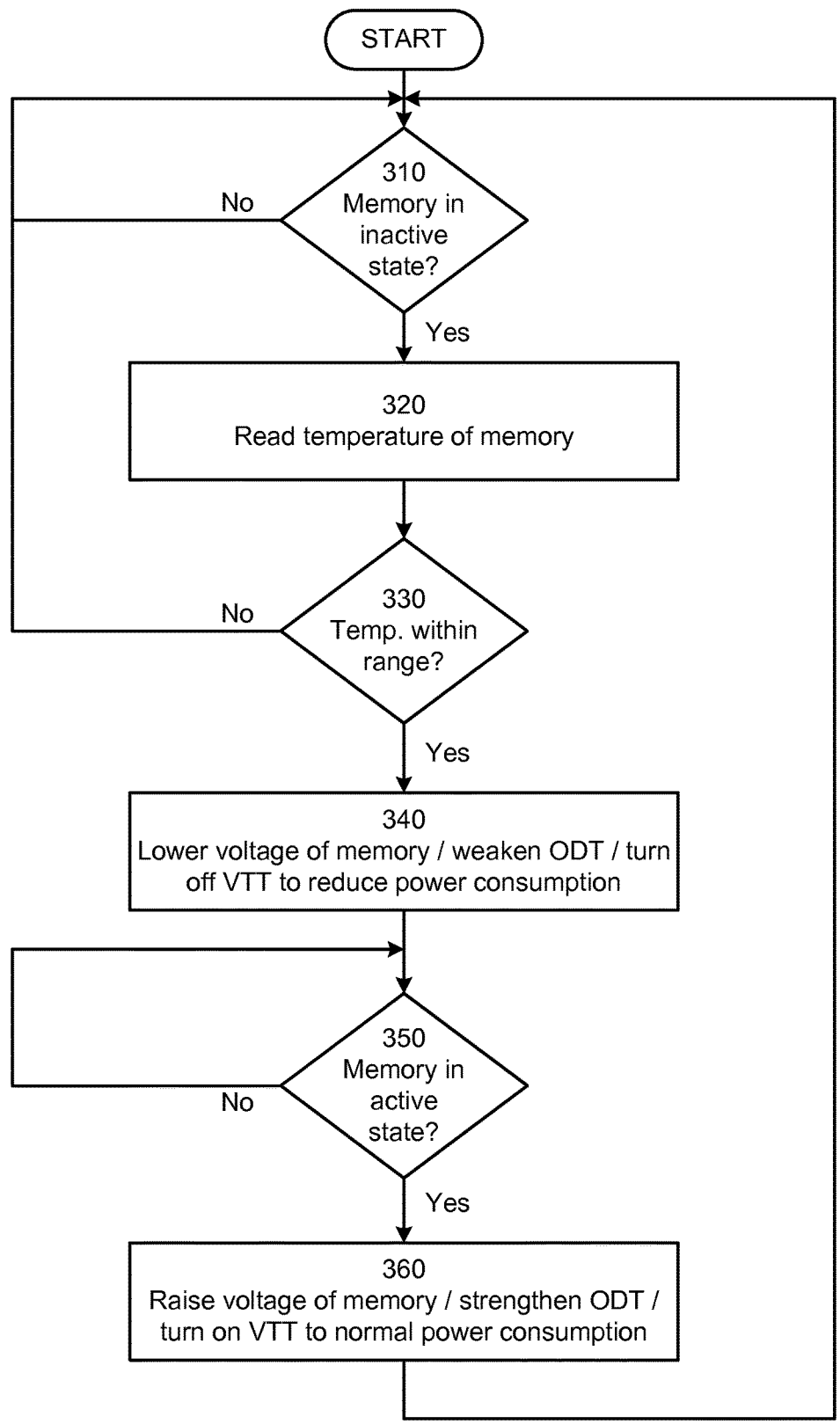
FIG. 3 illustrates a flow chart of dynamic power management of a memory device in accordance with one embodiment of the invention.

FIG. 3 illustrates a flow chart 300 of dynamic power management of a memory device in accordance with one embodiment of the invention. For clarity of invention, FIG. 3 is discussed with reference to FIGS. 1 and 2. In step 310, the processing unit 210 checks if the memory 230 is in an inactive state. The inactive state includes, but is not limited to, the self refresh memory state, and any other state where the functional modules of the memory 230 can be switched off.

If no, the flow 300 goes back to step 310 to continue checking if the memory 230 is in an inactive state. If yes, the processing unit 210 reads the temperature of the memory 230 in step 320. In one embodiment of the invention, the processing unit 210 reads the digital signals that represent the temperature of the memory 230 in step 320.

In step 330, the processing unit 210 checks if the temperature of the memory 230 is within an acceptable range. For example, in one embodiment of the invention, the processing unit 210 checks if the temperature of the memory 230 is below a threshold in step 330. In one embodiment of the invention, the processing unit 210 checks if the temperature of the memory 230 is below a first threshold and checks if the temperature of the memory 230 is above a second threshold step in step 330.

If the temperature of the memory 230 is not within an acceptable range, the flow 300 goes back to step 310 to continue checking if the memory 230 is in an inactive state. If the temperature of the memory 230 is within an acceptable range, the processing unit 210 changes the settings of the memory to reduce the power consumption of the platform 200 in step 340.

For example, in one embodiment of the invention, the processing unit 210 changes the settings of the memory to reduce the power consumption of the platform 200 by indicating to the voltage regulator 220 to switch off the termination voltage of the address and/or data signals. In one embodiment of the invention, the processing unit 210 changes the settings of the memory to reduce the power consumption of the platform 200 by indicating to the voltage regulator 220 to reduce the voltage of the power rail of the memory 230. In one embodiment of the invention, the reduced voltage is set between the fail voltage 118 and the minimum voltage 116.

In another embodiment of the invention, the processing unit 210 changes the settings of the memory to reduce the power consumption of the platform 200 by weakening or decreasing the pull up strength of the pulled up signals between the processing unit 210 and the memory 230. The pulled up signals refer to signals that have a pull up resistor coupled between the signal and a voltage supply.

In another embodiment of the invention, the processing unit 210 changes the settings of the memory to reduce the power consumption of the platform 200 by weakening or decreasing the pull up strength of the pulled up signals between the processing unit 210 and the memory 230. The pulled up signals refer to signals that have a pull up resistor coupled between the signal and a voltage supply. In another embodiment of the invention, the processing unit 210 changes the settings of the memory to reduce the power consumption of the platform 200 by weakening or decreasing the pull down strength of the pulled up signals between the processing unit 210 and the memory 230. The pulled down signals refer to signals that have a pull down resistor coupled between the signal and a ground voltage.

In step 350, the processing unit 210 checks if there is any request to change the memory 230 to an active state. If no, the flow 300 goes back to step 350 to continue checking if there is any request to change the memory 230 to an active state. If yes, the processing unit 210 changes the settings of the memory to the normal power consumption of the platform 200 and the flow 300 goes back to step 310.

Figure 4:
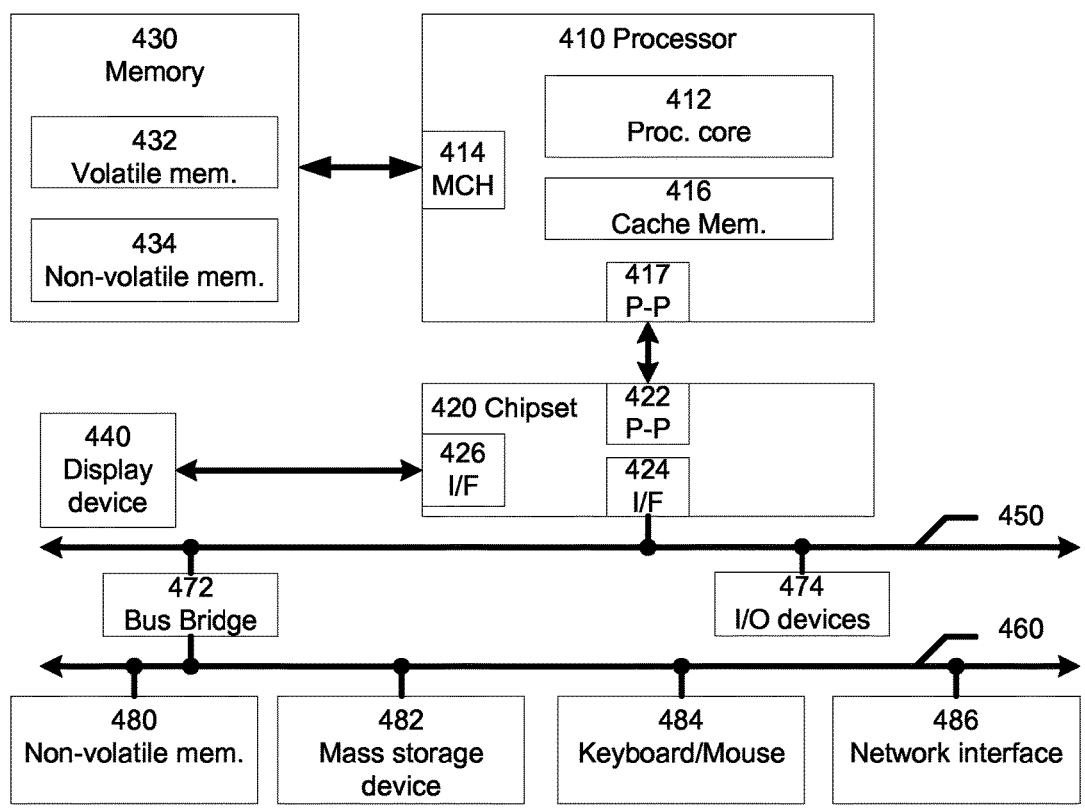
FIG. 4 illustrates a system in accordance with one embodiment of the invention.

FIG. 4 illustrates a system in accordance with one embodiment of the invention. The system 400 includes, but is not limited to, a desktop computer, a laptop computer, a netbook, a notebook computer, a personal digital assistant (PDA), a server, a workstation, a cellular telephone, a mobile computing device, an Internet appliance or any other type of computing device. In another embodiment, the system 400 used to implement the methods disclosed herein may be a system on a chip (SOC) system.

The processor 410 has a processing core 412 to execute instructions of the system 400. The processing core 412 includes, but is not limited to, pre-fetch logic to fetch instructions, decode logic to decode the instructions, execution logic to execute instructions and the like. The processor 410 has a cache memory 416 to cache instructions and/or data of the system 400. In another embodiment of the invention, the cache memory 416 includes, but is not limited to, level one, level two and level three, cache memory or any other configuration of the cache memory within the processor 410.

The memory control hub (MCH) 414 performs functions that enable the processor 410 to access and communicate with a memory 430 that includes a volatile memory 432 and/or a non-volatile memory 434. The volatile memory 432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 434 includes, but is not limited to, NAND flash memory, NOR flash memory, phase change memory (PCM), read only memory (ROM), electrically erasable programmable read only memory (EEPROM), or any other type of non-volatile memory device.

The memory 430 stores information and instructions to be executed by the processor 410. The memory 430 may also stores temporary variables or other intermediate information while the processor 410 is executing instructions. The chipset 420 connects with the processor 410 via Point-to-Point (PtP) interfaces 417 and 422. The chipset 420 enables the processor 410 to connect to other modules in the system 400. In one embodiment of the invention, the interfaces 417 and 422 operate in accordance with a PtP communication protocol such as the Intel® QuickPath Interconnect (QPI) or the like. The chipset 420 connects via the interface 426 to a display device 440 that includes, but is not limited to, liquid crystal display (LCD), cathode ray tube (CRT) display, or any other form of visual display device.

In addition, the chipset 420 connects via the interface 424 to one or more buses 450 and 460 that interconnect the various modules 474, 480, 482, 484, and 486. Buses 450 and 460 may be interconnected together via a bus bridge 472 if there is a mismatch in bus speed or communication protocol. The chipset 420 couples with, but is not limited to, a non-volatile memory 480, a mass storage device(s) 482, a keyboard/mouse 484 and a network interface 486. The mass storage device 482 includes, but is not limited to, a solid state drive, a hard disk drive, an universal serial bus flash memory drive, or any other form of computer data storage medium. The network interface 486 is implemented using any type of well known network interface standard including, but not limited to, an Ethernet interface, a universal serial bus (USB) interface, a Peripheral Component Interconnect (PCI) Express interface, a wireless interface and/or any other suitable type of interface. The wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 4 are depicted as separate blocks within the system 400, the functions performed by some of these blocks may be integrated within a single semiconductor circuit or may be implemented using two or more separate integrated circuits. For example, although the cache memory 416 is depicted as a separate block within the processor 410, the cache memory 416 can be incorporated into the processor core 412 respectively. The system 400 may include more than one processor/processing core in another embodiment of the invention.

Although examples of the embodiments of the disclosed subject matter are described, one of ordinary skill in the relevant art will readily appreciate that many other methods of implementing the disclosed subject matter may alternatively be used. In the preceding description, various aspects of the disclosed subject matter have been described. For purposes of explanation, specific numbers, systems and configurations were set forth in order to provide a thorough understanding of the subject matter. However, it is apparent to one skilled in the relevant art having the benefit of this disclosure that the subject matter may be practiced without the specific details. In other instances, well-known features, components, or modules were omitted, simplified, combined, or split in order not to obscure the disclosed subject matter.

The term "is operable" used herein means that the device, system, protocol etc, is able to operate or is adapted to operate for its desired functionality when the device or system is in off-powered state. Various embodiments of the disclosed subject matter may be implemented in hardware, firmware, software, or combination thereof, and may be described by reference to or in conjunction with program code, such as instructions, functions, procedures, data structures, logic, application programs, design representations or formats for simulation, emulation, and fabrication of a design, which when accessed by a machine results in the machine performing tasks, defining abstract data types or low-level hardware contexts, or producing a result.

The techniques shown in the figures can be implemented using code and data stored and executed on one or more computing devices such as general purpose computers or computing devices. Such computing devices store and communicate (internally and with other computing devices over a network) code and data using machine-readable media, such as machine readable storage media (e.g., magnetic disks; optical disks; random access memory; read only memory; flash memory devices; phase-change memory) and machine readable communication media (e.g., electrical, optical, acoustical or other form of propagated signals—such as carrier waves, infrared signals, digital signals, etc.).

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter.

What is claimed is:

1. A method comprising:
   determining that a memory device is in an inactive state; and
   in response to determining that the memory device is in the inactive state, determining whether a power consumption of the memory device may be reduced based, at least in part, on a temperature of the memory device, including:
      in response to determining the temperature of the memory device is below a temperature threshold, communicating with a voltage regulator coupled with the memory device to reduce a supply voltage output to the memory device, wherein the reduced supply voltage is set between a first voltage level and a second voltage level, the second voltage level being higher than the first voltage level, wherein the memory device fails if the supply voltage is set below the first voltage level when the temperature of the memory device is below the temperature threshold, and wherein the second voltage level is a memory device manufacturer specified minimum level of the supply voltage required to operate the memory device correctly for all memory states; and
      in response to determining the temperature of the memory device is above the temperature threshold, maintaining the supply voltage output to the memory device.

2. The method of claim 1, wherein the inactive state comprises a self refresh mode of the memory device.

3. The method of claim 1, further comprising:
   communicating with the voltage regulator coupled with the memory device to disable a termination voltage of the memory device.

4. The method of claim 1, further comprising:
   changing an on-die termination of one or more signals of a processor that are coupled with the memory device.

5. An apparatus comprising:
   processor logic circuitry and/or stored program code to:
      determine that a memory device is in an inactive state; and
      in response to determining that the memory device is in the inactive state, determine whether a power consumption of the memory device may be reduced based, at least in part, on a temperature of the memory device, including:

in response to determining the temperature of the memory device is below a temperature threshold, communicate with a voltage regulator coupled with the memory device to reduce a supply voltage output to the memory device, wherein the reduced supply voltage is set between a first voltage level and a second voltage level, the second voltage level being higher than the first voltage level, wherein the memory device fails if the supply voltage is set below the first voltage level when the temperature of the memory device is below the temperature threshold, and wherein the second voltage level is a memory device manufacturer specified minimum level of the supply voltage required to operate the memory device correctly for all memory states; and in response to determining the temperature of the memory device is above the temperature threshold, maintain the supply voltage of the memory device.

6. The apparatus of claim 5, wherein the processor logic circuitry and/or program code is further to dynamically change a strength of on-die termination of one or more signals coupled with the memory device based at least in part on an operating mode of the memory device, on supply voltage of the memory device, or on the temperature of the memory device.

7. The apparatus of claim 6, wherein the processor logic circuitry and/or program code is to dynamically change the strength of on-die termination of the one or more signals coupled with the memory device based at least in part on the operating mode of the memory device is to:

dynamically change a strength of pull down resistors of at least one of the one or more signals coupled with the memory device; and dynamically change a strength of pull up resistors of at least one of the one or more signals coupled with the memory device.

8. The apparatus of claim 5, wherein the processor logic circuitry and/or program code is further to:

communicate with the voltage regulator coupled with the memory device to disable a termination voltage of the memory device.

9. The apparatus of claim 5, wherein the inactive state comprises a self-refresh state.

10. A system comprising:
a memory device;
a voltage regulator coupled with the memory device; and
processor logic circuitry and/or program code to:
determine that the memory device is in an inactive state; and
in response to determining that the memory device is in the inactive state, determine whether a power consumption of the memory device may be reduced based, at least in part, on a temperature of the memory device, including:
in response to determining the temperature of the memory device is below a temperature threshold, communicate with the voltage regulator to reduce a supply voltage of the memory device, wherein the reduced supply voltage is set between a first voltage level and a second voltage level, the second voltage level being higher than the first voltage level, wherein the memory device fails if the supply voltage is set below the first voltage level when the temperature of the memory device is below the temperature threshold, and wherein the second voltage level is a memory device manufacturer specified minimum level of the supply voltage required to operate the memory device correctly for all memory states; and
in response to determining the temperature of the memory device is above the temperature threshold, maintain the supply voltage of the memory device.

11. The system of claim 10, wherein the inactive state comprises a self refresh mode of the memory device.

12. The system of claim 10, wherein the processor logic circuitry and/or stored program code is further to:
communicate with the voltage regulator to disable a termination voltage of the memory device.

13. The system of claim 10, wherein the processor logic circuitry and/or stored program code is further to:
change an on-die termination of one or more signals of the processor logic that are coupled with the memory device.

14. . The system of claim 10, wherein the memory device comprises Double Data Rate (DDR) Dynamic Random Access Memory (DRAM) device.

* * * * *